United States Patent
Lee et al.

(10) Patent No.: US 8,221,889 B2
(45) Date of Patent: Jul. 17, 2012

(54) FLEXIBLE SUBSTRATE, METHOD OF FABRICATING THE SAME, AND THIN FILM TRANSISTOR USING THE SAME

(75) Inventors: Jae-Seob Lee, Suwon-si (KR); Dong-Un Jin, Suwon-si (KR); Yeon-Gon Mo, Suwon-si (KR); Tae-Woong Kim, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 225 days.

(21) Appl. No.: 12/379,648

(22) Filed: Feb. 26, 2009

(65) Prior Publication Data
US 2009/0256154 A1    Oct. 15, 2009

(30) Foreign Application Priority Data

Feb. 29, 2008   (KR) ........................ 10-2008-0018873

(51) Int. Cl.
   *B32B 15/04*    (2006.01)
   *H05H 1/24*    (2006.01)
(52) U.S. Cl. ........ 428/469; 428/450; 428/457; 428/470; 428/472; 428/427.2; 428/606; 427/579
(58) Field of Classification Search .................. 428/450, 428/457, 469, 470, 472, 472.2, 606; 427/579
   See application file for complete search history.

(56) References Cited

U.S. PATENT DOCUMENTS

| 6,765,249 B2 | 7/2004 | Voutsas et al. |
| 6,911,666 B2 | 6/2005 | Voutsas |
| 7,045,469 B2 | 5/2006 | Sohn et al. |
| 7,692,381 B2 | 4/2010 | Kwon et al. |
| 2006/0011917 A1* | 1/2006 | Koo et al. ........................ 257/66 |
| 2008/0012014 A1 | 1/2008 | Park et al. |

FOREIGN PATENT DOCUMENTS

| JP | 61-012048 | 1/1986 |
| JP | 09-270516 | 10/1997 |
| JP | 2004-048005 | 2/2004 |
| JP | 2004-165688 | 6/2004 |
| JP | 2005-259818 | 9/2005 |
| KR | 10-1998-0028949 A | 7/1998 |
| KR | 10-2002-0088277 A | 11/2002 |
| KR | 10-2004-0054441 A | 6/2004 |
| KR | 10-2004-0078978 A | 9/2004 |

OTHER PUBLICATIONS

Website: Chapter 7 Materials for MEMS and Microsystems, www.engr.sjsu.edu/trhsu/ME189_Chapter%207.pdf.*

* cited by examiner

*Primary Examiner* — Timothy Speer
(74) *Attorney, Agent, or Firm* — Lee & Morse, P.C.

(57) ABSTRACT

A flexible substrate for a TFT includes a metal substrate having a predetermined coefficient of thermal expansion, and a buffer layer on the metal substrate, the buffer layer including a silicon oxide or a silicon nitride, wherein the predetermined coefficient of thermal expansion of the metal substrate satisfies an equation as follows, $$\alpha_f + 0.162 \times \frac{(1-v_f)}{E_f} \le \alpha_s \le \alpha_f + 0.889 \times \frac{(1-v_f)}{E_f}$$

$E_f$ representing Young's modulus of the buffer layer, $v_f$ representing Poisson's ratio of the buffer layer, $\alpha_f$ representing a coefficient of thermal expansion of the buffer layer, and $\alpha_s$ representing the predetermined coefficient of thermal expansion of the metal substrate.

23 Claims, 5 Drawing Sheets

FLEXIBLE SUBSTRATE, METHOD OF FABRICATING THE SAME, AND THIN FILM TRANSISTOR USING THE SAME

BACKGROUND OF THE INVENTION

1. Field of the Invention

Embodiments of the present invention relate to a flexible substrate, a method of fabricating the same, and a thin film transistor (TFT) using the same. More particularly, embodiments of the present invention relate to a flexible substrate exhibiting reduced deformation during fabrication thereof.

2. Description of the Related Art

Flat panel display devices, e.g., liquid crystal display (LCD) devices, organic light emitting diode (OLED) display devices, and so forth, may include thin and lightweight display panels. For example, since the OLED display devices do not need a back light, the OLED display devices may be implemented in ultra-thin display devices. Flat panel display devices, e.g., OLED display devices, may also exhibit high brightness and a wide viewing angle.

A conventional flat panel display device may include a flexible substrate, e.g., to minimize alignment difficulties and/or damage to the substrate due to external impacts during manufacturing thereof. For example, a conventional flexible substrate may be formed of plastic or metal.

A conventional flexible substrate formed of plastic, however, cannot be used in a process for forming a TFT of polysilicon or in a high-temperature deposition process for forming an electrode or light emitting diode (LED) on the flexible substrate due to low thermal resistance. A conventional flexible substrate formed of metal, however, may be deformed during manufacturing thereof despite a relatively higher thermal resistance and flexibility as compared to the plastic substrate.

In particular, when, e.g., a TFT and/or a LED is formed on the conventional metal substrate, the metal substrate may include a buffer layer to insulate the TFT and/or the LED from the metal substrate. However, since a difference of coefficients of thermal expansion of the metal substrate, i.e., a conductive material, and the buffer layer, i.e., an insulating material, is substantially large, an excessive residual stress may be generated in the buffer layer, thereby deforming, e.g., bending, the metal substrate attached thereto. Deformation of the metal substrate may cause delamination of the buffer layer from the metal substrate, thereby deteriorating the insulating properties of the buffer layer.

SUMMARY OF THE INVENTION

Embodiments of the present invention are therefore directed to a flexible substrate, a method of fabricating the same, and a TFT using the same, which substantially overcome one or more of the disadvantages of the related art.

It is therefore a feature of an embodiment of the present invention to provide a flexible substrate capable of preventing or substantially minimizing deformation thereof.

It is therefore another feature of an embodiment of the present invention to provide a flexible substrate capable of preventing or substantially minimizing delamination of a buffer layer attached thereto.

It is yet another feature of an embodiment of the present invention to provide a method of manufacturing a flexible substrate exhibiting one or more of the above features.

It is still another feature of an embodiment of the present invention to provide a TFT including a flexible substrate exhibiting one or more of the above features.

At least one of the above and other features and advantages of the present invention may be realized by providing a flexible substrate, including a metal substrate having a predetermined coefficient of thermal expansion, and a buffer layer on the metal substrate, the buffer layer including a silicon oxide or a silicon nitride, wherein the predetermined coefficient of thermal expansion of the metal substrate satisfies an equation as follows, $$\alpha_f + 0.162 \times \frac{(1-v_f)}{E_f} \le \alpha_s \le \alpha_f + 0.889 \times \frac{(1-v_f)}{E_f}$$

$E_f$ representing Young's modulus of the buffer layer, $v_f$ representing Poisson's ratio of the buffer layer, $\alpha_f$ representing a coefficient of thermal expansion of the buffer layer, and $\alpha_s$ representing the predetermined coefficient of thermal expansion of the metal substrate.

The buffer layer may include a silicon oxide, and the predetermined coefficient of thermal expansion of the metal substrate may be from about 2.86 ppm/° C. to about 11.48 ppm/° C. The buffer layer may include a silicon nitride, and the predetermined coefficient of thermal expansion of the metal substrate may be from about 3.19 ppm/° C. to about 8.01 ppm/° C. The predetermined coefficient of thermal expansion of the metal substrate may satisfy an equation as follows:

$$\alpha_f + 0.270 \times \frac{(1-v_f)}{E_f} \le \alpha_s \le \alpha_f + 0.741 \times \frac{(1-v_f)}{E_f}$$

The buffer layer may include a silicon oxide, and the predetermined coefficient of thermal expansion of the metal substrate may be from about 4.14 ppm/° C. to about 9.72 ppm/° C. The buffer layer may include a silicon nitride, and the predetermined coefficient of thermal expansion of the metal substrate may be from about 3.79 ppm/° C. to about 7.05 ppm/° C.

At least one of the above and other features and advantages of the present invention may be realized by providing a method of fabricating a flexible substrate, including forming a metal substrate having a predetermined coefficient of thermal expansion, and forming a buffer layer on the metal substrate, the buffer layer including a silicon oxide or a silicon nitride, wherein the predetermined coefficient of thermal expansion of the metal substrate satisfies an equation as follows:

$$\alpha_f + 0.162 \times \frac{(1-v_f)}{E_f} \le \alpha_s \le \alpha_f + 0.889 \times \frac{(1-v_f)}{E_f}$$

$E_f$ representing Young's modulus of the buffer layer, $v_f$ representing Poisson's ratio of the buffer layer, $\alpha_f$ representing a coefficient of thermal expansion of the buffer layer, and $\alpha_s$ representing the predetermined coefficient of thermal expansion of the metal substrate.

The buffer layer may be formed of a silicon oxide, and the metal substrate may have a coefficient of thermal expansion ranging from about 2.86 ppm/° C. to about 11.48 ppm/° C. The buffer layer may be formed of a silicon nitride, and the metal substrate may have a coefficient of thermal expansion ranging from about 3.19 ppm/° C. to about 8.01 ppm/° C. The predetermined coefficient of thermal expansion of the metal substrate may satisfy an equation as follows:

$$\alpha_f + 0.270 \times \frac{(1-v_f)}{E_f} \le \alpha_s \le \alpha_f + 0.741 \times \frac{(1-v_f)}{E_f}$$

The buffer layer may be formed of a silicon oxide, and the metal substrate may have a coefficient of thermal expansion ranging from about 4.14 ppm/° C. to about 9.72 ppm/° C. The buffer layer may be formed of a silicon nitride, and the metal substrate may have a coefficient of thermal expansion ranging from about 3.79 ppm/° C. to about 7.05 ppm/° C. The buffer layer may be formed on the metal substrate at a temperature of about 300° C. to about 400° C.

At least one of the above and other features and advantages of the present invention may be realized by providing a TFT, including a metal substrate having a predetermined coefficient of thermal expansion, a buffer layer on the metal substrate, the buffer layer including a silicon oxide or a silicon nitride, a semiconductor layer on the buffer layer, the semiconductor layer including a source region, a drain region, and a channel region, a gate electrode on the semiconductor layer, the gate electrode overlapping the channel region of the semiconductor layer, a gate insulating layer between the semiconductor layer and the gate electrode, a source electrode electrically connected with the source region of the semiconductor layer, and a drain electrode electrically connected with the drain region of the semiconductor layer, wherein the predetermined coefficient of thermal expansion of the metal substrate may satisfie an equation as follows, $$\alpha_f + 0.162 \times \frac{(1-v_f)}{E_f} \le \alpha_s \le \alpha_f + 0.889 \times \frac{(1-v_f)}{E_f}$$

$E_f$ representing Young's modulus of the buffer layer, $v_f$ representing Poisson's ratio of the buffer layer, $\alpha_f$ representing a coefficient of thermal expansion of the buffer layer, and $\alpha_s$ representing the predetermined coefficient of thermal expansion of the metal substrate.

The buffer layer may include a silicon oxide, and the predetermined coefficient of thermal expansion of the metal substrate may be from about 2.86 ppm/° C. to about 11.48 ppm/° C. The buffer layer may include a silicon nitride, and the predetermined coefficient of thermal expansion of the metal substrate may be from about 3.19 ppm/° C. to about 8.01 ppm/° C. The predetermined coefficient of thermal expansion of the metal substrate may satisfy an equation as follows:

$$\alpha_f + 0.270 \times \frac{(1-v_f)}{E_f} \le \alpha_s \le \alpha_f + 0.741 \times \frac{(1-v_f)}{E_f}$$

The buffer layer may include a silicon oxide, and the predetermined coefficient of thermal expansion of the metal substrate may be from about 4.14 ppm/° C. to about 9.72 ppm/° C. The buffer layer may include a silicon nitride, and the predetermined coefficient of thermal expansion of the metal substrate may be from about 3.79 ppm/° C. to about 7.05 ppm/° C.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
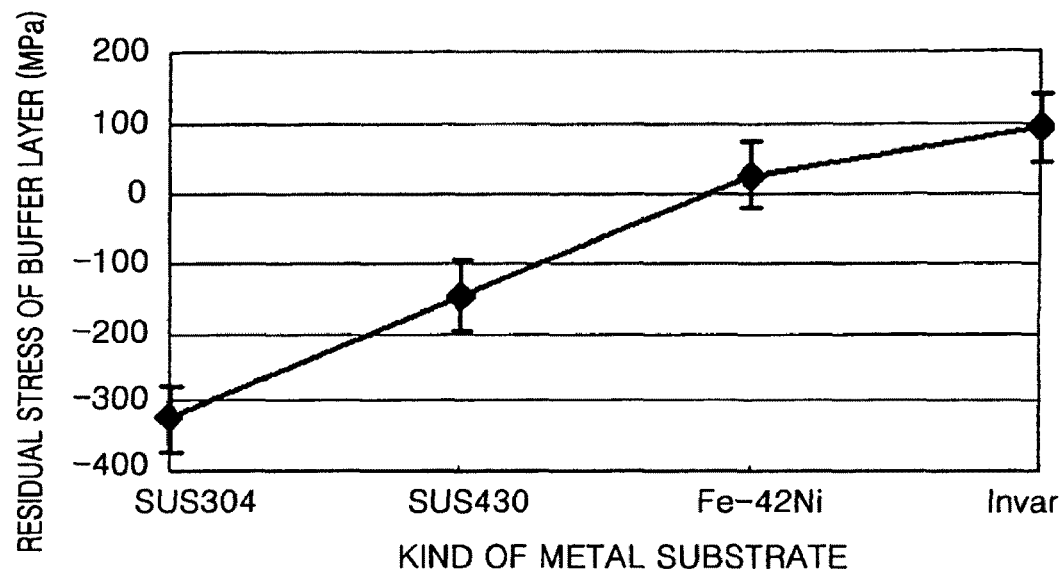
FIG. 1 illustrates a graph of dependency of residual stress generated in a buffer layer with respect to coefficients of thermal expansion of metal substrates attached thereto.

Korean Patent Application No. 10-2008-0018873, filed on Feb. 29, 2008, in the Korean Intellectual Property Office, and entitled: "Flexible Substrate, Method of Fabricating the Same, and Thin Film Transistor Using the Same," is incorporated by reference herein in its entirety.

Embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers, elements, and regions may be exaggerated for clarity of illustration. It will also be understood that when a layer or element is referred to as being "on" another layer, element, or substrate, it can be directly on the other layer, element, or substrate, or intervening layers and/or elements may also be present. Further, it will also be understood that when a layer or element is referred to as being "between" two layers or elements, it can be the only layer or element between the two layers or elements, or one or more intervening layers and/or elements may also be present. In addition, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

A flexible substrate and a TFT according to embodiments of the present invention may include a metal substrate with a buffer layer thereon, so a metal material of the metal substrate may be determined with respect to properties of the buffer layer. In particular, the coefficient of thermal expansion of the metal substrate may be determined in accordance with characteristics of the buffer layer, so thermal stress of the buffer layer and intrinsic stress of the buffer layer may have opposite signs and close absolute values to substantially minimize residual stress of the buffer layer.

An exemplary embodiment of a flexible substrate, a method of fabricating the same, and a TFT using the same according to embodiments of the present invention will be described in more detail below with reference to the accompanying figures. FIGS. 5A-5D illustrate cross-sectional views of a TFT during sequential steps of fabrication thereof according to an exemplary embodiment of the present invention.

Figure 5A:
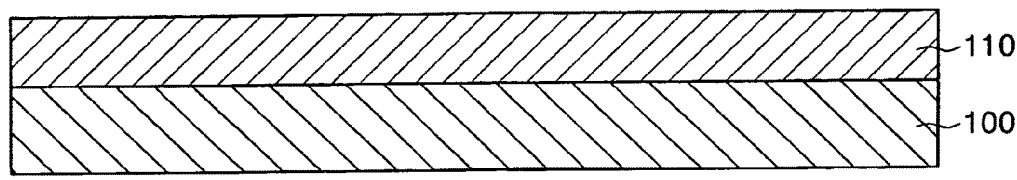
FIGS. 5A-5D illustrate cross-sectional views of sequential procedures of fabricating a TFT according to an exemplary embodiment of the present invention.

Referring to FIG. 5A, a buffer layer 110 may be formed on a metal substrate 100. The buffer layer 110 may be formed of an insulating material, e.g., a silicon oxide or a silicon nitride, and the metal substrate 100 may be formed of a metal material having a predetermined coefficient of thermal expansion. The predetermined coefficient of thermal expansion of the metal substrate 100 may be adjusted with respect to properties of the buffer layer 110 to provide minimized residual stress of the buffer layer 110 as will be discussed in more detail below.

The buffer layer 110 may be formed on the metal substrate 100 by any suitable deposition process at a temperature of about 300° C. to about 400° C. If the buffer layer 110 is formed at a temperature of less than about 300° C., density of the buffer layer 110 may be decreased, and insulating properties of the buffer layer 110 may be degraded. If the buffer layer 110 is formed at a temperature of more than about 400° C., the density of the buffer layer 110 may be too high, thereby causing deformation, e.g., bending, of the metal substrate 100.

The buffer layer 110 may be formed to a thickness of about 5,000 angstroms to about 15,000 angstroms. If the buffer layer 110 is formed to a thickness less than about 5,000 angstroms, the metal substrate 100 may not be sufficiently insulated from an element formed on the buffer layer 110, e.g., a TFT. If the buffer layer 110 is formed to a thickness of more than about 15,000 angstroms, formation and processing time of the buffer layer 110 may be increased, thereby reducing yield.

The metal substrate 100 may be formed of a metal having a coefficient of thermal expansion adjusted with respect to properties of the buffer layer 110. In particular, the metal material of the metal substrate 100 may be determined so the residual stress of the buffer layer 110 may be minimized in order to prevent or substantially reduce deformation, e.g., bending, of the metal substrate 100 and delamination of the buffer layer 110 from the metal substrate 100. For example, the metal substrate 100 may be formed of iron-nickel alloy, e.g., Fe-42Ni or Fe-36Ni (Invar).

Generally, the residual stress of a buffer layer formed on a metal substrate may be determined by Equation (1) below, $$\sigma_r = \sigma_{int} + \sigma_{epi} + \sigma_{th} \tag{1}$$

wherein $\sigma_r$ refers to the residual stress of the buffer layer, $\sigma_{int}$ refers to an intrinsic stress of the buffer layer, $\sigma_{epi}$ refers to an epitaxial stress of the buffer layer, and $\sigma_{th}$ refers to a thermal stress of the buffer layer. The intrinsic stress $\sigma_{int}$ may refer to stress generated during formation of the buffer layer, regardless of the metal substrate supporting the buffer layer, and may vary with respect to external conditions, i.e., environment, surrounding the buffer layer during formation thereof. The epitaxial stress $\sigma_{epi}$ may refer to stress generated when a single crystalline having a predetermined orientation is grown to a thin layer with respect to another crystalline surface. The thermal stress $\sigma_{th}$ may refer to stress generated during formation of the buffer layer on the metal substrate.

For example, if the buffer layer 110 according to embodiments of the present invention is formed of a silicon oxide or a silicon nitride, the intrinsic stress $\sigma_{int}$ of the buffer layer 110 may be about 100 MPa to about 200 MPa. The epitaxial stress $\sigma_{epi}$ of the buffer layer 110 may have a value substantially close to zero (0), since the buffer layer 110 is amorphous. The thermal stress $\sigma_{th}$ of the buffer layer 110 may be determined according to Equation (2) below, $$\sigma_{th} = \frac{-E_f}{1 - v_f} \times (\alpha_s - \alpha_f) \times \Delta T \tag{2}$$

wherein $E_f$ refers to Young's modulus of the buffer layer 110, $v_f$ refers to a Poisson's ratio of the buffer layer 110, $\alpha_f$ refers to a coefficient of thermal expansion of the buffer layer 110, $\alpha_s$ refers to a coefficient of thermal expansion of the metal substrate 100, and $\Delta T$ refers to a temperature difference between room temperature, e.g., about 20° C. to about 30° C., and temperature in a processing chamber during deposition of the buffer layer 110.

If the epitaxial stress $\sigma_{epi}$ of the buffer layer 110 is negligible, i.e., has a value substantially close to zero (0), the residual stress $\sigma_r$ of the buffer layer 110 formed on the metal substrate 110 may be expressed by a sum of the intrinsic stress $\sigma_{int}$ and the thermal stress $\sigma_{th}$ of the buffer layer 110. Therefore, a thermal stress $\sigma_{th}$ of a buffer layer 110 formed of a silicon oxide or a silicon nitride may be expressed by incorporating Equation (2) and values of the intrinsic and epitaxial stresses $\sigma_{int}$ and $\sigma_{epi}$, i.e., an intrinsic stress $\sigma_{int}$ of about 100 MPa to about 200 MPa and an epitaxial stress $\sigma_{epi}$ of about zero, into Equation (1) as represented by Equation (3) below.

$$100 + \frac{-E_f}{1 - v_f} \times (\alpha_s - \alpha_f) \times \Delta T \le \sigma_r \le 200 + \frac{-E_f}{1 - v_f} \times (\alpha_s - \alpha_f) \times \Delta T \tag{3}$$

The residual stress $\sigma_r$ of the buffer layer 110 in Equation (3) may be minimized, i.e., set as zero, and $\Delta T$ in Equation (3) may be calculated as a difference between the processing temperature of the buffer layer 110, i.e., a temperature of about 300° C. to about 400° C., to the room temperature. Accordingly, the coefficient of thermal expansion $\alpha_s$ of the metal substrate 110 according to Equation (3) may be determined with respect to the material used to form the buffer layer 110, and may be expressed by Equation (4) below.

$$\alpha_f + 0.270 \times \frac{(1 - v_f)}{E_f} \le \alpha_s \le \alpha_f + 0.741 \times \frac{(1 - v_f)}{E_f} \tag{4}$$

Therefore, if the buffer layer 110 is formed of, e.g., silicon oxide or silicon nitride, on the metal substrate 100, the residual stress $\sigma_r$ of the buffer layer 100 may approach 0 by determining the coefficient of thermal expansion $\alpha_s$ of the metal substrate 100 by Equation (4), so that the bending of the metal substrate 100 due to the buffer layer 110 and the delamination of the buffer layer 110 from the metal substrate 100 may be prevented or substantially minimized.

For example, if the buffer layer 110 is formed of a silicon oxide, the Young's modulus of the buffer layer is 70 Gpa, the Poisson's ratio thereof is 0.17, and a coefficient of thermal expansion $\alpha_s$ thereof is 0.94 ppm/° C. Accordingly, the thermal stress $\sigma_{th}$ of a silicon oxide buffer layer 110 formed on, e.g., a metal substrate 100 formed of Fe-42Ni, may be about (−60) MPa as calculated by Equation (2) above, so the residual stress $\sigma_r$ thereof may range from about 40 MPa to about 140 MPa. Accordingly, it may be concluded that a metal substrate 100 formed of Fe-42Ni may not bend when the residual stress $\sigma_r$ of the buffer layer 110 ranges from about 0 MPa to about 140 MPa. It is noted that since a negative curvature indicates deformation of the metal substrate in an opposite direction as compared with a positive curvature, it may be determined that a metal substrate 100 formed of Fe-42Ni may not bend when the residual $\sigma_r$ stress of the buffer layer 110 ranges from about (−140) MPa to about 140 MPa.

Using Equation (3), when the buffer layer 110 has a residual stress $\sigma_r$ ranging from about (−140) MPa to about 140 MPa, the coefficient of thermal expansion $\alpha_s$ of the metal substrate 100 may be determined by Equation (5) represented below.

$$a_f + 0.162 \times \frac{(1-v_f)}{E_f} \leq \alpha_s \leq \alpha_f + 0.889 \times \frac{(1-v_f)}{E_f} \quad (5)$$

As a result, it may be determined that the coefficient of thermal expansion $\alpha_s$ of a flexible metal substrate may be controlled to adjust a residual stress $\sigma_r$ of a buffer layer formed of a silicon oxide or a silicon nitride thereon to a value ranging from about (−140) MPa to about 140 MPa, e.g., about zero MPa, so bending of the metal substrate and the delamination of the buffer layer therefrom may be prevented or substantially minimized.

In particular, the coefficient of thermal expansion $\alpha_s$ of the metal substrate 100 when the residual stress $\sigma_r$ of the buffer layer 110 ranges from about (−140) MPa to about 140 MPa may be determined by Equation. For example, when the buffer layer 110 is formed of a silicon oxide, the Young's modulus of the silicon oxide is about 70 Gpa, the Poisson's ratio thereof is about 0.17, and the coefficient of thermal expansion $\alpha_f$ thereof is about 0.94 ppm/° C. Thus, the coefficient of thermal expansion $\alpha_s$ of the metal substrate 100 may be represented by Equation (6) as follows.

2.86 ppm/° C.$\leq \alpha_s \leq$11.48 ppm/° C. (6)

In another example, when the buffer layer 110 is formed of a silicon nitride, the Young's modulus of the silicon nitride may range from about 120 GPa to about 140 GPa, the Poisson's ratio is about 0.23, and the coefficient of thermal expansion $\alpha_f$ is about 2.3 ppm/° C. Thus, the coefficient of thermal expansion $\alpha_s$ of the metal substrate 100 may be represented by Equation (7) as follows.

3.19 ppm/° C.$\leq \alpha_s \leq$8.01 ppm/° C. (7)

When the residual stress $\sigma_r$ of the buffer layer 110 approaches about 0 MPa, the coefficient of thermal expansion $\alpha_s$ of the metal substrate 100 may be determined by Equation (4). Accordingly, when the buffer layer 110 is formed of a silicon oxide or a silicon nitride, the coefficient of thermal expansion $\alpha_s$ of the metal substrate 100 may represented by Equations (8) and (9), respectively, as follows.

4.14 ppm/° C.$\leq \alpha_s \leq$9.72 ppm/° C. (8)

3.79 ppm/° C.$\leq \alpha_s \leq$7.05 ppm/° C. (9)

Figure 5B:
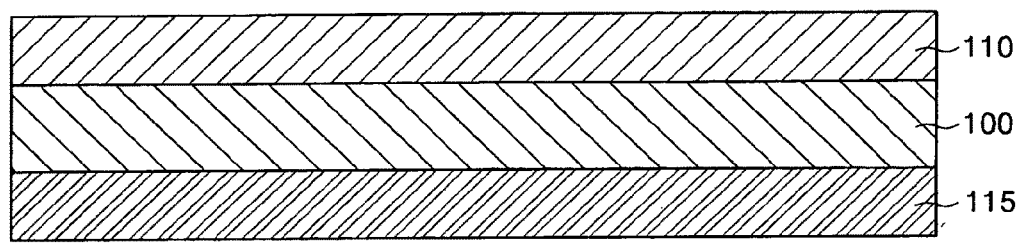

Next, as illustrated in FIG. 5B, an oxidation barrier layer 115 may be formed on the metal substrate 100. In particular, the oxidation barrier layer 115 may be formed on a surface opposite the buffer layer 110, as illustrated in FIG. 5B, so the metal substrate 110 may be positioned between the buffer layer 110 and the oxidation barrier layer 115. The oxidation barrier layer 115 may prevent or substantially minimize chemical contamination or damage to the metal substrate 100 caused by subsequent processes. The oxidation barrier layer 115 may be formed of one or more of a silicon oxide and a silicon nitride. The oxidation barrier layer 115 and the buffer layer 110 may be formed simultaneously on the metal substrate 100.

The oxidation barrier layer 115 may be formed to a thickness of about 300 angstroms to about 600 angstroms. If the oxidation barrier layer 115 is formed to a thickness of less than about 300 angstroms, the thickness is too low to prevent chemical contamination or damage to the metal substrate 100. If the oxidation barrier layer 115 is formed to a thickness of more than about 600 angstroms, it may affect the bending of the metal substrate 100 and may increase formation time to decrease yield.

Figure 5C:
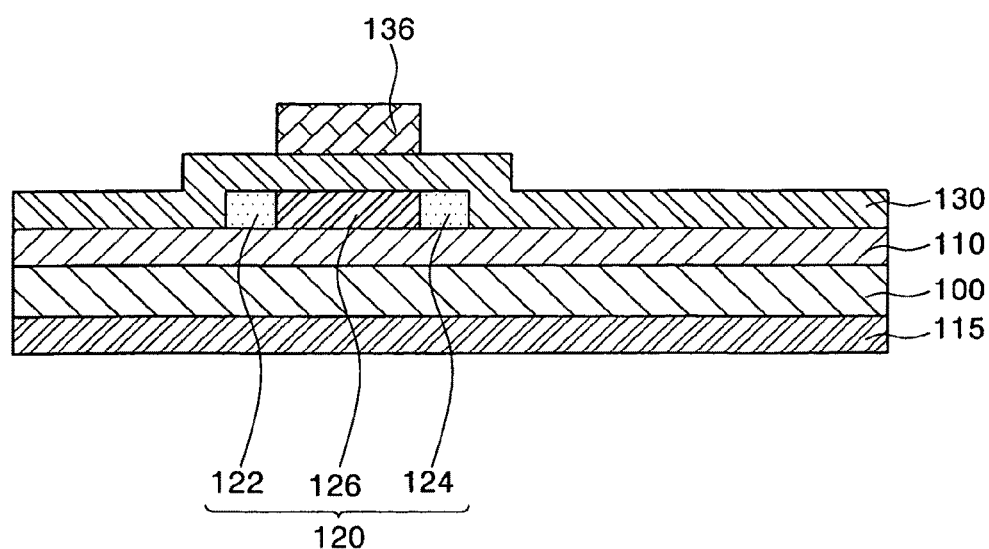

Subsequently, as illustrated in FIG. 5C, an amorphous silicon layer (not illustrated) may be formed on the buffer layer 110, followed by crystallization thereof into a polycrystalline silicon layer. The polycrystalline silicon layer may be patterned to form a semiconductor layer 120 on the buffer layer 110. It is noted that while the semiconductor layer 120 is formed of polycrystalline silicon, other configurations of the semiconductor layer 120, e.g., the semiconductor layer 120 may be formed of amorphous silicon, are within the scope of the present invention. Once the semiconductor layer 120 is formed, a gate insulating layer 130 may be formed of an insulating material, e.g., one or more of a silicon oxide ($SiO_x$) and a silicon nitride ($SiN_x$), on the buffer layer 110 to cover an upper surface of the buffer layer 110 and the semiconductor layer 120.

A gate electrode 136 may be formed on the gate insulating layer 130 of metal, e.g., one or more of aluminum (Al), chromium (Cr), molybdenum (Mo), and an alloy thereof. The gate electrode 136 may be formed by depositing a single layer of metal or multiple layers of metal on the gate insulating layer 130, followed by etching the metal, e.g., by photolithography, to form the gate electrode 136 in a region corresponding to a predetermined region of the semiconductor layer 120. The predetermined region of the semiconductor layer 120 may be a channel region 126, so the gate electrode 136 may be formed above and overlap the channel region 126. It is noted that while the gate electrode 136 of the TFT may be formed on the semiconductor layer 120, as illustrated in FIGS. 5C-5D, other configurations of the gate electrode 136, e.g., the gate electrode 136 of the TFT may be formed under the semiconductor layer 120, are within the scope of the present invention.

The gate electrode 136 may be used as a mask to dope the semiconductor layer 120 with conductive impurities to form a source region 122 and a drain region 124 on each side of the channel region 126, respectively. In other words, a portion of the semiconductor region 120 corresponding to the gate electrode 136 may define the channel region 126, and may not be doped with conductive impurities, while peripheral regions of the semiconductor region 120 adjacent to the channel region 126 may be doped to define the source and drain regions 122 and 124. It is further noted that even though the gate electrode 136 may be used as a mask to dope the semiconductor layer 120, other doping methods, e.g., forming a photoresist mask on the semiconductor region 120 before forming the gate electrode 136, are within the scope of the present invention.

Figure 5D:
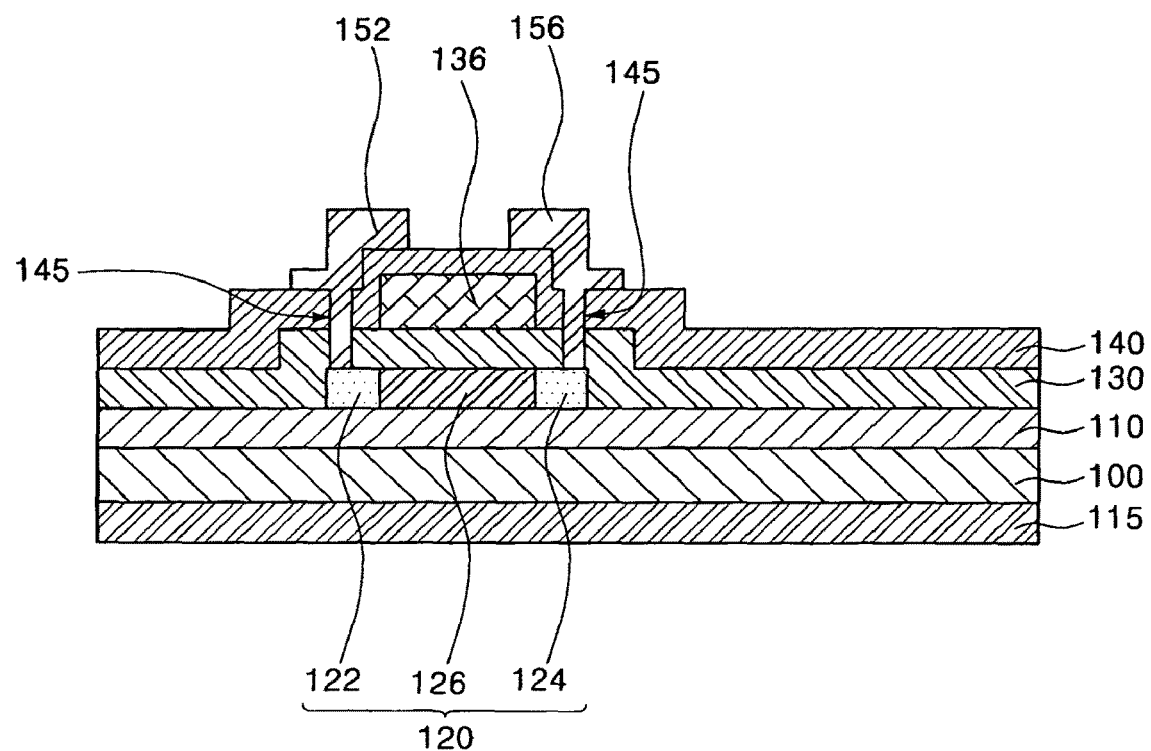

Next, as illustrated in FIG. 5D, an interlayer insulating layer 140 may be formed on the metal substrate 100. The interlayer insulating layer 140 may cover an upper surface of the gate insulating layer 130 and the gate electrode 136. The interlayer insulating layer 140 and the gate insulating layer 130 may be etched to from contact holes 145 therethrough to partially expose the source and drain regions 122 and 124 of the semiconductor layer 120. The interlayer insulating layer 140 may be formed of an insulating material, e.g., one or more of a silicon oxide ($SiO_x$) and a silicon nitride ($SiN_x$).

A conductive material layer (not illustrated) may be formed on the interlayer insulating layer 140 to cover an upper surface of the interlayer insulating layer 140 and to fill the contact holes 145. The conductive material layer may be patterned to form source and drain electrodes 152 and 156 electrically connected with the source and drain regions 122 and 124, respectively, through the contact holes 145 to complete formation of the TFT. The conductive material layer may be formed of a material having a high electron mobility, e.g., one or more of molybdenum-tungsten (Mo—W), aluminum (Al), aluminum-neodymium (Al—Nd), and/or a combination thereof.

Example

A silicon oxide layer was formed on four different metal substrates. In particular, a silicon oxide layer was formed on a stainless steel 304 (SUS 304) substrate, on a stainless steel 430 (SUS 430) substrate, on a Fe-42Ni substrate, and on an Invar substrate. It is noted that a coefficient of thermal expansion as of stainless steel 304 (SUS 304) is 17.3 ppm/° C., a coefficient of thermal expansion as of stainless steel 430 (SUS 430) is 10.5 ppm/° C., a coefficient of thermal expansion as of Fe-42Ni is 3.238 ppm/° C., and a coefficient of thermal expansion $\alpha_s$ of Invar is 1.2 ppm/° C. The silicon oxide layer was formed on each of the metal substrates at 330° C. A residual stress $\sigma_r$ of each of the silicon oxide layers and a curvature of each of the metal substrates was measured. Results are reported in FIGS. 1-2.

Figure 2:
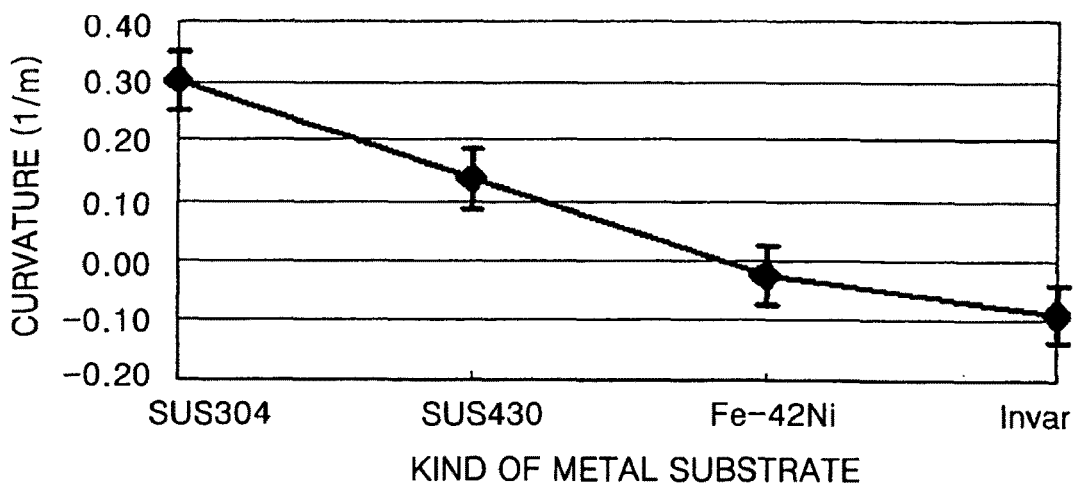
FIG. 2 illustrates a graph of curvature of each metal substrate with respect to residual stress generated in a respective buffer layer illustrated in FIG. 1.

As illustrated in FIGS. 1-2, as a coefficient of thermal expansion of a metal substrate increased, the residual stress of a corresponding buffer layer thereon, i.e., silicon oxide layer, increased. Further, deformation, i.e., curvature, of the metal substrate was minimized as the residual stress approached zero. It is noted with respect to FIG. 2 that directions of curvatures are indicated with +/− signs, i.e., a negative sign indicates a metal substrate bending in an opposite direction with respect to a bending direction of a metal substrate having a curvature having a positive sign. In view of FIGS. 1-2, it can be determined that when the coefficient of thermal expansion of the metal substrate is controlled so the residual stress of the buffer layer is minimized, e.g., approached zero in FIG. 1, bending of the metal substrate and delamination of the buffer layer from the metal substrate may be prevented or substantially minimized, as illustrated in FIG. 2.

Figure 3A:
FIGS. 3A-3B illustrate photographs of metal substrates formed of stainless steel 304 (SUS 304) and Fe-42Ni, respectively.
Figure 3B:
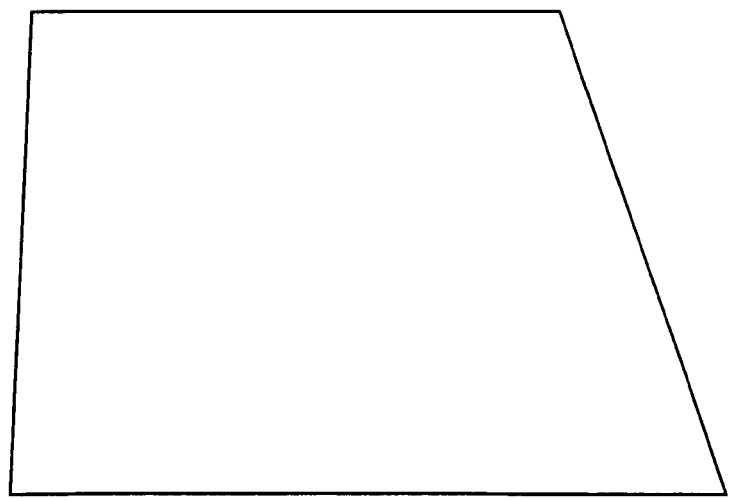
Figure 4A:
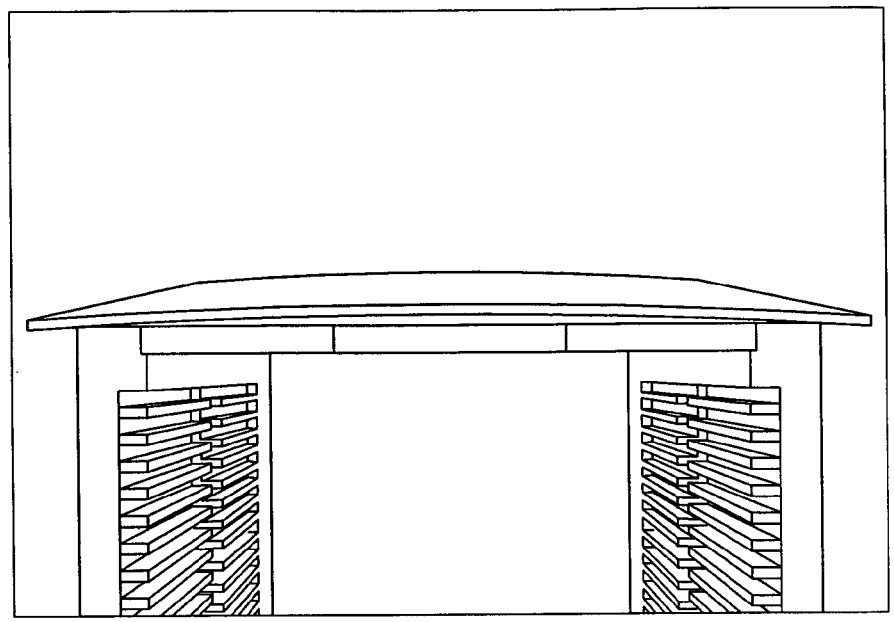
FIGS. 4A-4B illustrate photographs of deformation of the metal substrates in FIGS. 3A-4A, respectively.
Figure 4B:
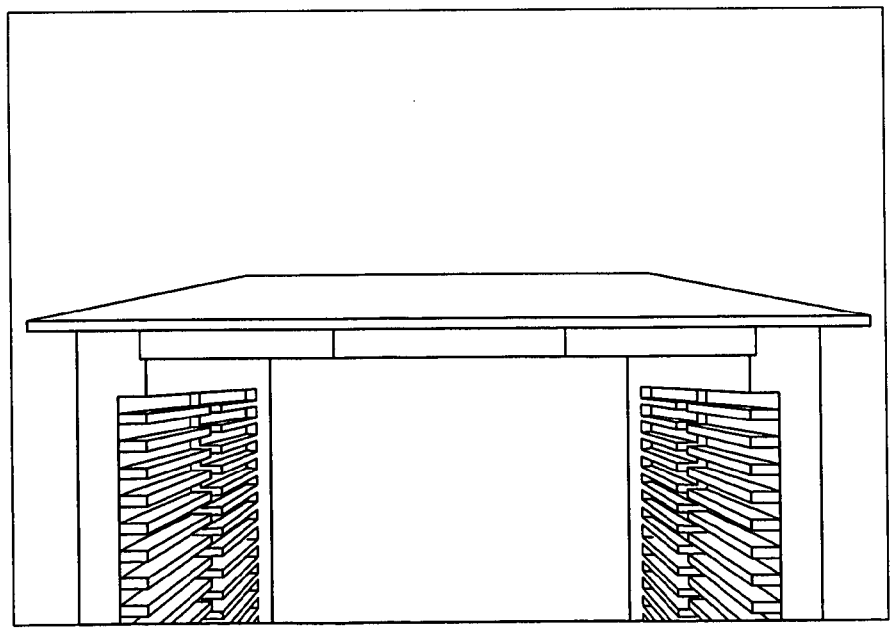

FIGS. 3A-3B illustrate photographs of the metal substrates formed of stainless steel 304 (SUS 304) and of Fe-42Ni, respectively. FIGS. 4A-4B illustrate photographic results after measuring curvatures of the metal substrate of FIGS. 3A-3B, respectively. Referring to FIGS. 3A and 4A, the stainless steel 304 substrate had a curvature of 0.3/m, and the silicon oxide was delaminated from a specific region of the stainless steel 304 substrate. As opposed to the stainless steel 304 substrate in FIGS. 3A and 4A, the Fe-42Ni substrate illustrated in FIGS. 3B and 4B had no curvature of 0/m, and the silicon oxide was not delaminated from the Fe-42Ni substrate.

A TFT according to exemplary embodiments of the present invention may include a flexible metal substrate having a coefficient of thermal expansion adjusted according to the material of the buffer layer formed on the metal substrate. In other words, the materials of the metal substrate and the buffer layer may be chosen with respect to each other, so the residual stress of the buffer layer formed on the metal substrate may be substantially minimized. Consequently, in a flexible substrate and a TFT using the same, as the residual stress of the buffer layer is minimized by determining the coefficient of thermal expansion of the metal substrate according to characteristics of the buffer layer formed on the metal substrate, bending of the metal substrate and delamination of the buffer layer from the metal substrate may be prevented or substantially minimized, thereby improving insulating properties of the buffer layer.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A flexible substrate, comprising:
a metal substrate having a predetermined coefficient of thermal expansion; and
a buffer layer on the metal substrate, the buffer layer including a silicon oxide or a silicon nitride,
wherein the predetermined coefficient of thermal expansion of the metal substrate satisfies an equation as follows,

$$\alpha_f + 0.162 \times \frac{(1-v_f)}{E_f} \le \alpha_s \le \alpha_f + 0.889 \times \frac{(1-v_f)}{E_f}$$

$E_f$ representing Young's modulus of the buffer layer, $V_f$ representing Poisson's ratio of the buffer layer, $\alpha_f$ representing a coefficient of thermal expansion of the buffer layer, and $\alpha_s$ representing the predetermined coefficient of thermal expansion of the metal substrate.

2. The flexible substrate as claimed in claim 1, wherein the buffer layer includes a silicon oxide, and the predetermined coefficient of thermal expansion of the metal substrate is from about 2.86 ppm/° C. to about 11.48 ppm/° C.

3. The flexible substrate as claimed in claim 1, wherein the buffer layer includes a silicon nitride, and the predetermined coefficient of thermal expansion of the metal substrate is from about 3.19 ppm/° C. to about 8.01 ppm/° C.

4. The flexible substrate as claimed in claim 1, wherein the predetermined coefficient of thermal expansion of the metal substrate satisfies an equation as follows:

$$\alpha_f + 0.270 \times \frac{(1-v_f)}{E_f} \le \alpha_s \le \alpha_f + 0.741 \times \frac{(1-v_f)}{E_f}$$

5. The flexible substrate as claimed in claim 4, wherein the buffer layer includes a silicon oxide, and the predetermined coefficient of thermal expansion of the metal substrate is from about 4.14 ppm/° C. to about 9.72 ppm/° C.

6. The flexible substrate as claimed in claim 4, wherein the buffer layer includes a silicon nitride, and the predetermined coefficient of thermal expansion of the metal substrate is from about 3.79 ppm/° C. to about 7.05 ppm/° C.

7. A method of fabricating a flexible substrate, comprising:
forming a metal substrate having a predetermined coefficient of thermal expansion; and
forming a buffer layer on the metal substrate, the buffer layer including a silicon oxide or a silicon nitride,
wherein the predetermined coefficient of thermal expansion of the metal substrate satisfies an equation as follows:

$$\alpha_f + 0.162 \times \frac{(1-v_f)}{E_f} \leq \alpha_s \leq \alpha_f + 0.889 \times \frac{(1-v_f)}{E_f}$$

$E_f$ representing Young's modulus of the buffer layer, $V_f$ representing Poisson's ratio of the buffer layer, $\alpha_f$ representing a coefficient of thermal expansion of the buffer layer, and $\alpha_s$ representing the predetermined coefficient of thermal expansion of the metal substrate.

8. The method as claimed in claim 7, wherein the buffer layer is formed of a silicon oxide and the metal substrate has a coefficient of thermal expansion ranging from about 2.86 ppm/° C. to about 11.48 ppm/° C.

9. The method as claimed in claim 7, wherein the buffer layer is formed of a silicon nitride and the metal substrate has a coefficient of thermal expansion ranging from about 3.19 ppm/° C. to about 8.01 ppm/° C.

10. The method as claimed in claim 7, wherein the predetermined coefficient of thermal expansion of the metal substrate satisfies an equation as follows:

$$\alpha_f + 0.270 \times \frac{(1-v_f)}{E_f} \leq \alpha_s \leq \alpha_f + 0.741 \times \frac{(1-v_f)}{E_f}.$$

11. The method as claimed in claim 10, wherein the buffer layer is formed of a silicon oxide and the metal substrate has a coefficient of thermal expansion ranging from about 4.14 ppm/° C. to about 9.72 ppm/° C.

12. The method as claimed in claim 10, wherein the buffer layer is formed of a silicon nitride and the metal substrate has a coefficient of thermal expansion ranging from about 3.79 ppm/° C. to about 7.05 ppm/° C.

13. The method as claimed in claim 7, wherein the buffer layer is formed on the metal substrate at a temperature of about 300° C. to about 400° C.

14. A thin film transistor (TFT), comprising:
a metal substrate having a predetermined coefficient of thermal expansion; and
a buffer layer on the metal substrate, the buffer layer including a silicon oxide or a silicon nitride;
a semiconductor layer on the buffer layer, the semiconductor layer including a source region, a drain region, and a channel region;
a gate electrode on the semiconductor layer, the gate electrode overlapping the channel region of the semiconductor layer;
a gate insulating layer between the semiconductor layer and the gate electrode;
a source electrode electrically connected with the source region of the semiconductor layer; and
a drain electrode electrically connected with the drain region of the semiconductor layer,
wherein the predetermined coefficient of thermal expansion of the metal substrate satisfies an equation as follows, $$\alpha_f + 0.162 \times \frac{(1-v_f)}{E_f} \leq \alpha_s \leq \alpha_f + 0.889 \times \frac{(1-v_f)}{E_f}$$

$E_f$ representing Young's modulus of the buffer layer, $V_f$ representing Poisson's ratio of the buffer layer, $\alpha_f$ representing a coefficient of thermal expansion of the buffer layer, and $\alpha_s$ representing the predetermined coefficient of thermal expansion of the metal substrate.

15. The TFT as claimed in claim 14, wherein the buffer layer includes a silicon oxide, and the predetermined coefficient of thermal expansion of the metal substrate is from about 2.86 ppm/° C. to about 11.48 ppm/° C.

16. The TFT as claimed in claim 14, wherein the buffer layer includes a silicon nitride, and the predetermined coefficient of thermal expansion of the metal substrate is from about 3.19 ppm/° C. to about 8.01 ppm/° C.

17. The TFT as claimed in claim 14, wherein the predetermined coefficient of thermal expansion of the metal substrate satisfies an equation as follows:

$$\alpha_f + 0.270 \times \frac{(1-v_f)}{E_f} \leq \alpha_s \leq \alpha_f + 0.741 \times \frac{(1-v_f)}{E_f}.$$

18. The TFT as claimed in claim 17, wherein the buffer layer includes a silicon oxide, and the predetermined coefficient of thermal expansion of the metal substrate is from about 4.14 ppm/° C. to about 9.72 ppm/° C.

19. The TFT as claimed in claim 17, wherein the buffer layer includes a silicon nitride, and the predetermined coefficient of thermal expansion of the metal substrate is from about 3.79 ppm/° C. to about 7.05 ppm/° C.

20. The flexible substrate as claimed in claim 1, wherein:
the buffer layer is silicon oxide having a Young's modulus of the silicon oxide of about 70GPa, a Poisson's ratio of about 0.17, and a coefficient of thermal expansion $\alpha_f$ of about 0.94 ppm/° C., and
the predetermined coefficient of thermal expansion of the metal substrate is from about 2.86 ppm/° C. to about 11.48 ppm/° C.

21. The flexible substrate as claimed in claim 20, wherein the metal substrate is Fe-42Ni alloy.

22. The flexible substrate as claimed in claim 1, wherein the buffer layer is silicon nitride having a Young's modulus of the silicon nitride of about 120 to 140GPa, a Poisson's ratio of about 0.23, and a coefficient of thermal expansion $\alpha_f$ of about 2.3 ppm/° C., and
the predetermined coefficient of thermal expansion of the metal substrate is from about 3.19 ppm/° C. to about 8.01 ppm/° C.

23. The flexible substrate as claimed in claim 22, wherein the metal substrate is Fe-42Ni alloy.

* * * * *